United States Patent

[11] 3,617,819

[72] Inventors Alfred R. Boisvert
Hillsboro;
Wilfred L. Boule, Antrim, both of N.H.

[21] Appl. No. 81,017
[22] Filed Oct. 15, 1970
[45] Patented Nov. 2, 1971
[73] Assignee Sylvania Electric Products Inc.

[54] A SEMICONDUCTOR DEVICE HAVING A CONNECTING PAD OF LOW RESISTIVITY SEMICONDUCTOR MATERIAL INTERCONNECTING GOLD ELECTRODES AND ALUMINUM CONTACTS OF AN ENCLOSURE
4 Claims, 2 Drawing Figs.

[52] U.S. Cl. ........ 317/234 R, 317/234 E, 317/234 F, 317/234 G, 317/234 H, 317/234 N, 174/3, 174/52, 29/589
[51] Int. Cl. ........ H01l 3/00, H01l 5/00
[50] Field of Search ........ 317/234, 29/584–589; 235, 1, 3, 3.1, 4, 5, 5.4; 174/52, 3; /

[56] References Cited

UNITED STATES PATENTS

| | | | |
|---|---|---|---|
| 3,484,533 | 12/1969 | Kauffman | 317/234 |
| 3,484,534 | 12/1969 | Kilby et al. | 317/234 |
| 3,524,249 | 8/1970 | Hamada et al. | 317/234 |
| 3,509,430 | 4/1970 | Mroz | 317/234 |
| 3,554,821 | 1/1971 | Caulton et al. | 317/234 |

*Primary Examiner*—James D. Kallam
*Assistant Examiner*—Andrew J. James
*Attorneys*—Norman J. O'Malley, Elmer J. Nealon and David M. Keay

ABSTRACT: A semiconductor device including the combination of an enclosure having leads with aluminum contact regions and a body of silicon having a gold electrode. The connecting path between the gold electrode and the aluminum contact region of a lead includes a connecting pad of low resistivity silicon with a layer of gold on one surface and a layer of aluminum on the other. Thus, direct gold-to-aluminum connections which produce harmful gold-aluminum compounds at elevated temperatures are avoided.

INVENTORS
ALFRED R. BOISVERT
WILFRED L. BOULE'
BY
David M. Kong
AGENT

A SEMICONDUCTOR DEVICE HAVING A CONNECTING PAD OF LOW RESISTIVITY SEMICONDUCTOR MATERIAL INTERCONNECTING GOLD ELECTRODES AND ALUMINUM CONTACTS OF AN ENCLOSURE

BACKGROUND OF THE INVENTION

This invention relates to semiconductor electrical translating devices. More particularly, it is concerned with the combination of a semiconductor element and the enclosure therefor.

One of the significant items in the cost of semiconductor devices is the package or enclosure in which the electrically active semiconductor element is placed. The enclosure protects the semiconductor element, and in addition provides connecting leads from the electrically active regions of the semiconductor element to the exterior of the enclosure. Certain types of enclosures have become accepted as standard in the semiconductor industry, and there has been impetus to reduce the cost of these enclosures.

An important factor in cost reduction has been the substitution of aluminum for more costly metals, particularly gold, as conductive members of the enclosures. However, the semiconductor elements of certain devices have electrodes of gold. The problems of rapid and serious deterioration of electrical connections containing aluminum-gold compounds which form at high temperatures are well known in the semiconductor industry. Therefore, in order to avoid these problems, connections between aluminum and gold must be avoided, even though this requirement necessitates the use of relatively expensive enclosures.

One specific example of devices concerned with the foregoing problems are multiple diode devices which include several diodes within a single body of silicon having one common gold electrode and several separate aluminum electrodes, one for each diode. These devices are intended to be low-cost items. However, in order to avoid the formation of gold-aluminum compounds, it has been necessary to employ relatively expensive enclosures for these devices. Thus, the cost of the enclosure represents a large percentage of the cost of the complete device while the body of silicon containing several diodes is itself relatively inexpensive.

SUMMARY OF THE INVENTION

A semiconductor device in accordance with the invention includes a semiconductor element having a gold electrode mounted in a standard low-cost enclosure in combination with other elements so as to avoid the formation of gold-aluminum compounds. The device includes a supporting member of insulating material with a plurality of contact members fixed to the supporting member. Each contact member has a region of aluminum. A substrate of insulating material having a layer of gold on a portion of its surface is fixed to the supporting member. The semiconductor element of the device includes a first body of semiconductor material which has the electrically active regions of the semiconductor device fabricated within it. A gold electrode on one surface of the first body of semiconductor material is in contact with an electrically active region. An aluminum electrode on the opposite surface of the semiconductor material is in contact with an electrically active region. The semiconductor element is mounted on the substrate with the gold electrode bonded to the layer of gold on the substrate.

The device also includes a connecting pad which is a second body of semiconductor material of low resistivity with a layer of gold on one surface and a layer of aluminum on the opposite surface. The connecting pad is mounted on the substrate with the layer of gold bonded to the layer of gold on the substrate. A connecting wire of aluminum is bonded to the aluminum electrode of the semiconductor element and to the aluminum region of one of the plurality of contact members fixed to the supporting member. Another connecting wire of aluminum is bonded to the layer of aluminum of the connecting pad and to the aluminum region of another of the plurality of contact members fixed to the supporting member. Thus, an electrical connection is provided from the gold electrode of the semiconductor element to a contact member with no gold-to-aluminum connections.

BRIEF DESCRIPTIONS OF THE DRAWINGS

Additional objects, features, and advantages of semiconductor devices in accordance with the present invention will be apparent from the following detailed discussion and the accompanying drawings wherein:

FIG. 1 is a perspective view of a multiple diode semiconductor device in accordance with the invention; and FIG. 2 is a detailed view in cross section of a portion of the device of FIG. 1.

Because of the extremely small size of various portions of the items illustrated in the drawings, some of the dimensions of many of the items have been exaggerated with respect to other dimensions. It is believed that greater clarity of presentation is thereby obtained despite consequent distortion of items in relation to their actual physical appearance.

DETAILED DESCRIPTION OF THE INVENTION

Figure 1:
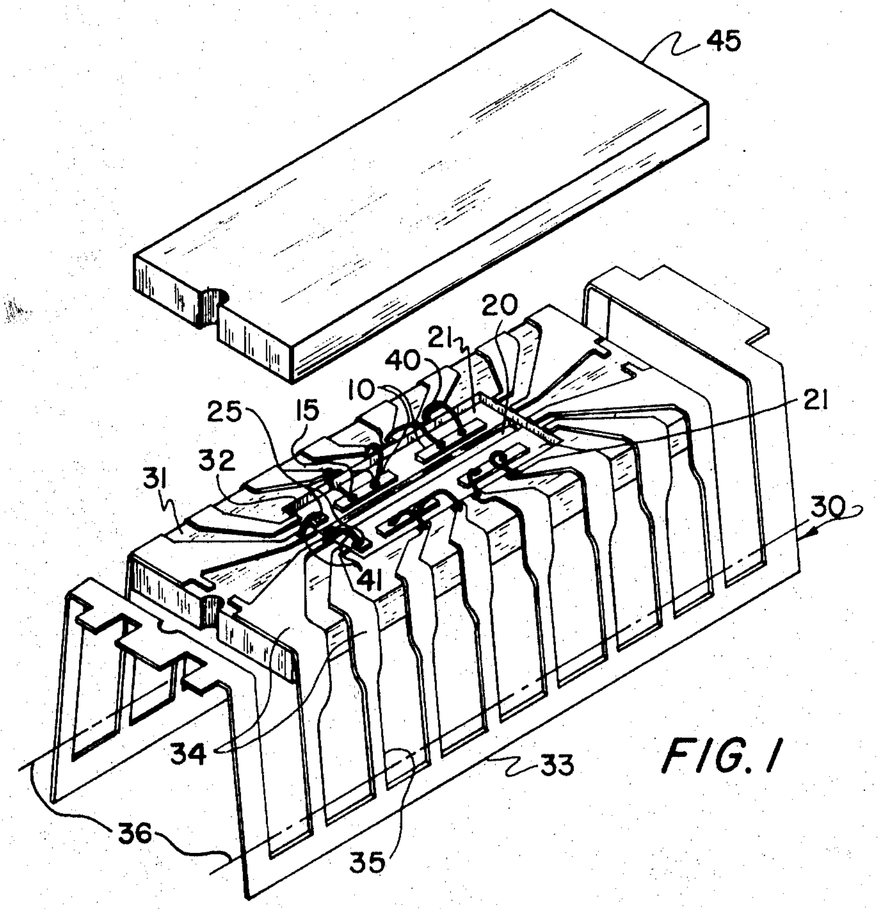
Figure 2:
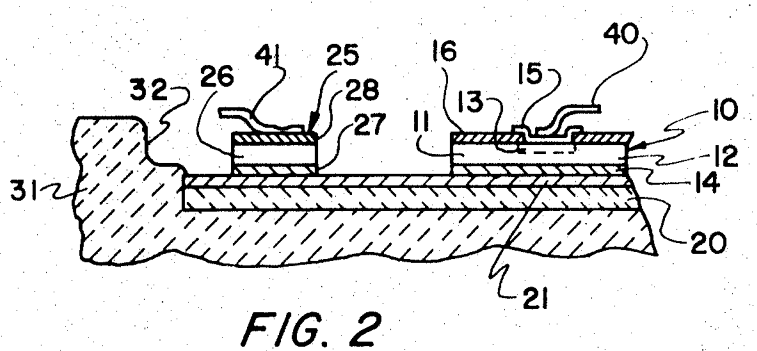

The multiple diode semiconductor device in accordance with the invention as illustrated in FIGS. 1 and 2 includes four separate semiconductor elements 10. Each semiconductor element 10 is a multiple diode structure including an elongated die 11 of semiconductor material, specifically silicon, having flat opposed major surfaces. The die 11 comprises a bulk region 12 of one conductivity type having diffused therein separate regions 13 of the opposite conductivity type. A gold electrode 14 is in ohmic contact with the bulk region 12 of the die at the lower major surface and individual aluminum electrodes 15 make ohmic contact to each of the diffused regions 13 at the upper surface. The edges of the rectifying junctions between the diffused regions 13 and the bulk region 12 are protected by a silicon oxide coating 16 as is well known in planar semiconductor devices.

The four semiconductor elements 10 are mounted on a thin, flat ceramic substrate 20. The upper surface of the ceramic substrate is metallized with a layer of gold 21 on two separate portions. Two of the semiconductor elements 10 are mounted on the ceramic substrate 20 with the gold electrode 14 of each element bonded to the layer of gold 21 on one portion of the ceramic substrate. The other two semiconductor elements are similarly mounted on the other metallized portion of the substrate.

For purposes of illustration the two semiconductor elements mounted on one metallized portion of the substrate each include two diodes with a common cathode and two separate anodes, and each of the two semiconductor elements mounted on the other metallized portion includes two diodes with a common anode and two separate cathodes.

In accordance with the present invention a connecting pad 25 is also mounted on each of the gold metallized portions 21 of the substrate. Each connecting pad 25 includes a chip or die 26 of low resistivity silicon. A layer of gold 27 is in ohmic contact with the lower major surface of the die and a layer of aluminum 28 is in ohmic contact with the opposite surface. The connecting pads 25 are mounted on the ceramic substrate 20 with the gold layer 27 bonded to the gold layer 21 on the substrate. In one specific example connecting pads 25 were fabricated from a wafer of silicon doped with boron to produce a uniform resistivity of approximately 0.002 ohm-centimeters. The wafer was approximately 5 mils thick. A layer of gold 27 approximately 6,000 A. thick was vacuum deposited on one surface of the wafer and a layer of aluminum 28 approximately 6,000 A. thick was vacuum deposited on the opposite surface. The wafer was sawed into individual dice each approximately 20 mils square.

The ceramic substrate 20 with the semiconductor elements 10 and the connecting pads 25 bonded to the layer of gold 21 is mounted on an enclosure structure 30. The enclosure structure 30 is a standard type widely used in the semiconductor industry. The structure includes a ceramic supporting member 31 having a layer of glass on its upper surface. The supporting member 31 has a flat upper surface encircling a central portion 32 which is slightly depressed. A conductive lead structure in the form of a unitary frame 33 is fixed to the supporting member 31 by contact regions 34 which are embedded in the glass layer on the upper surface of the supporting member. The lead frame is of kovar and the contact regions 34 are clad with aluminum on their upper surfaces. Lead portions 35 of the lead structure extend away from the central portion 32 of the supporting member. After the device has been completely assembled, as will be explained hereinbelow, the lead structure 33 is cut as indicated by the dashed lines 36 shown in FIG. 1, thus providing discrete contact members held in position by the supporting member 31.

Electrical connections are made between aluminum electrodes 15 of the semiconductor elements 10 and contact regions 34 by aluminum connecting wires 40. Similarly, aluminum wires 41 are connected between the aluminum layer 28 of each connecting pad 25 and a contact region 34. FIG. 1 illustrates one possible pattern of connections. The aluminum wires 40 and 41 may be bonded as by employing well-known ultrasonic or thermal compression bonding techniques.

As can be seen in the device as shown and described aluminum and gold do not come in contact. The connecting pads 25 each provide a connection between gold members and aluminum members while avoiding the possibility of contact between them. The connecting pads include only gold, aluminum, and silicon; and therefore, do not introduce additional materials which might be a source of contamination.

The device enclosure is completed by attaching a cover member 45 to the enclosure structure. The cover member 45 is substantially identical to the supporting member 31 and is of ceramic with a layer of glass on the lower surface. The cover member 45 is placed on the structure and then the assembly is heated to approximately 525° C. whereby the glass layers fuse to form a sealed enclosure surrounding the substrate 20, semiconductor elements 10, and connecting pads 25. Treatment at this temperature would seriously degrade electrical connections between gold and aluminum members by the formation of gold-aluminum compounds at their interface. Finally, the lead frame structure 33 is cut as indicated by the dashed lines 36 in FIG. 1 to complete the device.

While there has been shown and described what is considered a preferred embodiment of the present invention, it will be obvious to those skilled in the art that various changes and modifications may be made therein without departing from the invention as defined in the appended claims.

What is claimed is:

1. A semiconductor device comprising
- a supporting member of insulating material;
- a substrate of insulating material fixed to and mounted on said supporting member;
- a layer of gold on a portion of a surface of said substrate;
- a semiconductor element including
  - a first body of semiconductor material having a plurality of active regions with a PN junction formed therein
  - a gold electrode on one surface of said first body of semiconductor material in contact with an active region thereof, and
  - an aluminum electrode on the opposite surface of said first body of semiconductor material in contact with another active region thereof;
- said semiconductor element being mounted on said substrate with the gold electrode bonded to the layer of gold or said substrate;
- a connecting pad including
  - a second body of semiconductor material of low resistivity,
  - a layer of gold on one surface of the second body of semiconductor material, and
  - a layer of aluminum on the opposite surface of said second body of semiconductor material;
- said connecting pad being mounted on the substrate with said layer of gold on said connecting pad and being bonded to the layer of gold on said substrate;
- a plurality of aluminum contact members fixed to said supporting member of insulating material, a first connecting wire of aluminum having one end bonded to said aluminum electrode on said semiconductor element and the other end bonded to one of said plurality of aluminum contact members; and
- a second connecting wire of aluminum having one end bonded to the layer of aluminum on said connecting pad and the other end bonded to another of the plurality of aluminum contact members.

2. A semiconductor device in accordance with claim 1 wherein said supporting member has a generally flat upper surface and a recessed portion;
- said plurality of contact members each have a contact region of aluminum and a conductive lead portion, the plurality of contact regions being embedded in said flat upper surface and arranged in spaced apart relationship around said recessed portion of the supporting member, said lead portions extending away from the recessed portion of the supporting member;
- said substrate is a thin body of insulating material having flat opposed major surfaces;
- said substrate is mounted in the recessed portion of the supporting member with its lower major surface fixed to the supporting member;
- said layer of gold is on a portion of the upper major surface of the substrate;
- the first body of semiconductor material of the semiconductor element is a thin body having flat opposed major surfaces;
- the gold electrode is in contact with substantially the entire lower major surface of the first body of semiconductor material;
- the semiconductor element includes several aluminum electrodes on the upper major surface of the first body of semiconductor material, each being in contact with a different active region;
- the second body of semiconductor material of low resistivity is a thin body having flat opposed major surfaces;
- the layer of gold is on the lower major surface of the second body of semiconductor material;
- the layer of aluminum is on the upper major surface of the second body of semiconductor material;

and including
- several connecting wires of aluminum, each being bonded to a different one of the aluminum electrodes of the semiconductor element and to a different one of said plurality of aluminum contact members.

3. A semiconductor device in accordance with claim 2 wherein the semiconductor material of the first body of semiconductor material of the semiconductor element is silicon;
- the first body of semiconductor material has a major region of one conductivity type encompassing the entire lower major surface of the body and several separate regions of the opposite conductivity type, each in contact with a different one of said aluminum electrodes; and
- the semiconductor material of the second body of semiconductor material of the connecting pad is of silicon of the same conductivity type throughout.

4. A semiconductor device in accordance with claim 3 wherein the recessed portion of the supporting member is depressed below the flat upper surface encircling the recessed portion;
- said supporting member is of ceramic, the contact regions of the contact members being embedded in said supporting member.

* * * * *